United States Patent
Yamane et al.

(10) Patent No.: US 9,368,678 B2
(45) Date of Patent: Jun. 14, 2016

(54) SEMICONDUCTOR LIGHT EMITTING ELEMENT

(71) Applicant: STANLEY ELECTRIC CO., LTD., Tokyo (JP)

(72) Inventors: Takayoshi Yamane, Yokohama (JP); Ji-Hao Liang, Yokohama (JP); Mitsuyasu Kumagai, Yokohama (JP); Shunya Ide, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/839,516

(22) Filed: Aug. 28, 2015

(65) Prior Publication Data

US 2016/0087146 A1 Mar. 24, 2016

(30) Foreign Application Priority Data

Sep. 22, 2014 (JP) ................. 2014-192284

(51) Int. Cl.
*H01L 31/0336* (2006.01)
*H01L 21/00* (2006.01)
(Continued)

(52) U.S. Cl.
CPC ............ *H01L 33/06* (2013.01); *H01L 33/20* (2013.01); *H01L 33/32* (2013.01)

(58) Field of Classification Search
CPC . F21Y 2101/02; H01L 51/5012; H01L 33/06; H01L 33/20; H01L 33/38; H01L 33/0025; H01L 33/24; H01L 33/007; H01L 33/32; H01L 33/08; H01L 33/18; H01L 21/024; H01L 33/04; H01S 5/3216
USPC ............ 257/14, 15, 79, 98, 189, 191; 438/22, 438/42, 46, 47, 37, 69, 87
See application file for complete search history.

(56) References Cited

U.S. PATENT DOCUMENTS

| | | | |
|---|---|---|---|
| 6,537,839 B2 | 3/2003 | Ota et al. | |
| 8,129,711 B2 * | 3/2012 | Kang | .......... H01L 33/0075 257/17 |

(Continued)

FOREIGN PATENT DOCUMENTS

| | | |
|---|---|---|
| EP | 1667292 A1 | 6/2006 |
| JP | 2000232238 A | 8/2000 |
| JP | 2007150076 A | 6/2007 |
| JP | 2013041930 A | 2/2013 |

OTHER PUBLICATIONS

Extended European Search Report dated Feb. 5, 2016, issued in counterpart European Application No. 15186149.9.

(Continued)

*Primary Examiner* — Hsien Ming Lee
(74) *Attorney, Agent, or Firm* — Holtz, Holtz & Volek PC

(57) ABSTRACT

A semiconductor light emitting element includes: a pit formation layer formed on a first semiconductor layer and having a pyramidal pit; an active layer formed on the pit formation layer and having an embedded portion formed so as to embed the pit. The active layer has a multi-quantum well structure having at least one pair of well layer and barrier layer laminated alternately. The embedded portion has at least one embedded well portion corresponding to the well layer respectively and at least one embedded barrier portion corresponding to the barrier layer respectively. Each of the embedded well portion and the embedded barrier portion is configured such that a second apex angle of the embedded well portion is smaller than a first apex angle of the embedded barrier portion wherein the embedded well portion is subsequently formed on the embedded barrier portion.

4 Claims, 4 Drawing Sheets

(51) Int. Cl.
  *H01L 33/06* (2010.01)
  *H01L 33/20* (2010.01)
  *H01L 33/32* (2010.01)

(56) References Cited

U.S. PATENT DOCUMENTS

| | | | |
|---|---|---|---|
| 8,816,321 B2 | 8/2014 | Takeoka et al. | |
| 8,937,325 B2 * | 1/2015 | Kushibe | H01L 33/06 257/94 |
| 2006/0246612 A1 | 11/2006 | Emerson et al. | |
| 2007/0122994 A1 | 5/2007 | Sonobe et al. | |
| 2008/0217632 A1 | 9/2008 | Tomiya et al. | |
| 2014/0057417 A1 | 2/2014 | Leirer et al. | |
| 2015/0249181 A1 * | 9/2015 | Leirer | H01L 33/06 257/13 |

OTHER PUBLICATIONS

Hangleiter, et al., "Suppression of Nonradiative Recombination by V-Shaped Pits in GaInN/GaN Quantum Wells Produces a Large Increase in the Light Emission Efficiency", Physical Review Letters, American Physical Society, vol. D5, No. 12, Sep. 16, 2005; p. 127402-3, col. 1, lines 13-30; figures 1-3.

Nakamura, et al., "High-Quality InGaN Films Grown on GaN Films", Jan. 1, 2000, The Blue Laser Diode, Berlin : Springer; pp. 150-155.

Sheen, et al., "V-pits as Bafflers to Diffusion of Carriers in InGaN/GaN Quantum Wells", Journal of Electronic Materials, vol. 44, No. 11, Nov. 1, 2015; p. 4136, col. 2, line 1—p. 4137, line 10; figures 3b, 4.

\* cited by examiner

SEMICONDUCTOR LIGHT EMITTING ELEMENT

BACKGROUND OF THE INVENTION

1. Field of the Invention

The present invention relates to a semiconductor light emitting element such as a light emitting diode (LED).

2. Description of the Related Art

The semiconductor light emitting element is generally fabricated typically by forming, on a growth substrate, an n-type semiconductor layer, a light emitting layer, and a p-type semiconductor layer, and then by forming an n-electrode and a p-electrode which apply a voltage to the n-type semiconductor layer and the p-type semiconductor layer. When the semiconductor light emitting element is fabricated to use a nitride-based semiconductor material, a sapphire substrate is used as a growth substrate, for example.

Japanese Patent Application Kokai. 2000-232238 discloses a nitride semiconductor light emitting element which comprises an active layer, a barrier layer and a buried part consisting of the same material as the material for the barrier layer, which is defined by the interface extending to the periphery surrounding a threading dislocation in the active layer. Japanese Patent Application Kokai No. 2007-150076 discloses a nitride semiconductor light emitting element which comprises a substrate, an active layer and a superlattice layer made of nitride semiconductor wherein a pit formation layer for generating a pit is provided at the end of threading dislocation generated on the nitride semiconductor layer at the side of the substrate. Further, Japanese Patent Application Kokai No. 2013-41930 discloses a nitride semiconductor light emitting element which comprises an n-type nitride semiconductor layer, a V-pit generation layer, an intermediate layer, a multiple quantum well light emitting layer, and a p-type nitride semiconductor layer which are provided in that order wherein a V-pit is partly formed in the multiple quantum well light emitting layer, and an average position of starting point of the V pit is located in the intermediate layer.

SUMMARY OF THE INVENTION

When a semiconductor light emitting element is fabricated such that a nitride semiconductor layer is grown on a substrate made of a material different from the nitride semiconductor such as a sapphire substrate, crystal defects (misfit dislocations) occur at an interface between the substrate and the semiconductor layer due to their lattice mismatch. These crystal defects are formed so as to penetrate the semiconductor layer in the layered direction of the semiconductor layer during crystal growth. Each dislocation defect extending in the layered direction of the semiconductor layer is called a threading dislocation.

When the threading dislocation reaches the active layer in the semiconductor layer, the threading dislocation functions as non-radiation recombination center and becomes a factor of lowering the luminous efficiency. There is a method for avoiding the reaching of the threading dislocation to the active layer by making a pyramidal recess portion having an apex positioned at the end of the threading dislocation. This recess portion is called a pit having inclined side surfaces surrounding the threading dislocation.

When an active layer is grown on the pit after the pit formation, the active layer is layered on the inclined side surface of the pit at a growth rate slower than that on the other portion (flat portion). Therefore, the thickness of the active layer adjacent to the pit i.e., the threading dislocation becomes thinner, and its quantum energy level increases in comparison with the other portion of the active layer. Therefore, carriers are prevented from reaching the threading dislocation, so that lowering of the luminous efficiency can be prevented (i.e., pit function).

There are the pit formation methods as described in Japanese Patent Application Kokai No. 2000-232238, Japanese Patent Application Kokai No. 2007-150076 and Japanese Patent Application Kokai No. 2013-41930, which disclose that the semiconductor layer is grown at a low temperature prior to the growth of the active layer, and that the semiconductor layer having a super-lattice structure is formed, and that the semiconductor layer is grown while doping with a high concentration of Si, respectively. When the crystal growth is performed under one of such conditions, a dislocation point of the threading dislocation becomes an apex of a pit to starts the pit formation. Further, growth conditions of the active layer are adjusted after forming the pits, in general, taking into consideration of maintenance of the pit shape such as the apex angle of the pit.

However, when the pits are formed by using the foregoing methods, the crystal quality of the active layer is remarkably deteriorated. Specifically, when the semiconductor light emitting element made of GaN-based semiconductor is fabricated, when an InGaN layer is grown as the active layer at a low temperature, undulations (convexo-concave of wave) occurs in the active layer. By this, there are generated portions where carriers are localized in the active layer resulting in non-uniformity of the light emission distribution. Also, when a super-lattice structure layer is grown at a low temperature, the composition distribution in the layer becomes non-uniform, so that surface flatness of the semiconductor layer is deteriorated. The deterioration of crystal quality is actualized in such a manner that there occurs not only non-uniformity of the light emission distribution but also lowering of the luminous efficiency, when driven by a large current or driven at a high temperature.

The present invention has been made in view of the aforementioned respects. It is an object of the present invention to provide a semiconductor light emitting element having a uniform light emission distribution and having a high luminous efficiency while keeping the pit function.

A semiconductor light emitting element of the present invention is a semiconductor light emitting element comprising:

a first semiconductor layer of a first conductivity type;

a pit formation layer formed on said first semiconductor layer and having a pyramidal pit caused by a threading dislocation generated in said first semiconductor layer;

an active layer formed on said pit formation layer and having an embedded portion formed so as to embed said pit; and a second semiconductor formed on said active layer and having a second conductivity type which is opposite to the first conductivity type, wherein said active layer has a multi-quantum well structure having at least one well layer and at least one barrier layer laminated alternately in which each well layer and each barrier layer lie one upon another, said embedded portion has at least one embedded well portion corresponding to said at least one well layer respectively and at least one embedded barrier portion corresponding to said at least one barrier layer respectively, each of said at least one embedded well portion and said embedded barrier portion is configured such that, with respect to one of said at least one embedded well portion and one of said at least one embedded barrier portion which are situated adjacent to each other, a second apex angle of an apex of said one of said at least one embedded well portion is smaller than a first apex angle of an apex of said one of said at least one embedded barrier portion wherein said one of said at least one embedded well portion is subsequently formed on said one of said at least one embedded barrier portion.

BRIEF DESCRIPTION OF THE DRAWINGS

The aforementioned aspects and other features of the present invention are explained in the following description, taken in connection with the accompanying drawing figures wherein.

DETAILED DESCRIPTION OF THE INVENTION

Hereinafter, various embodiments of the present invention will be described in detail with reference to the drawings.

First Embodiment

Figure 1A:
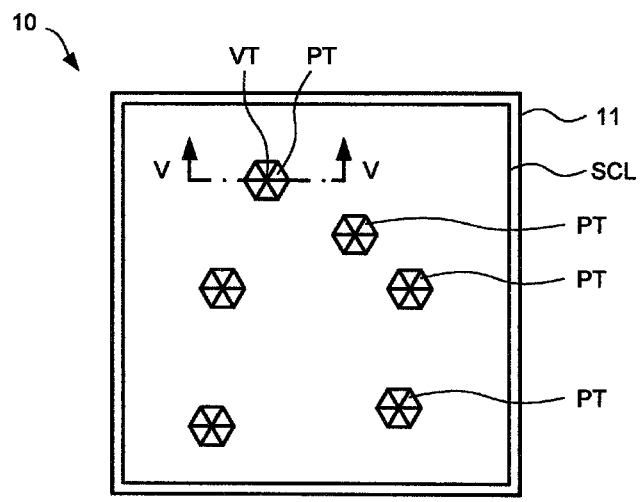
FIG. 1A shows a top view of the semiconductor light emitting element of a first embodiment.
Figure 1B:
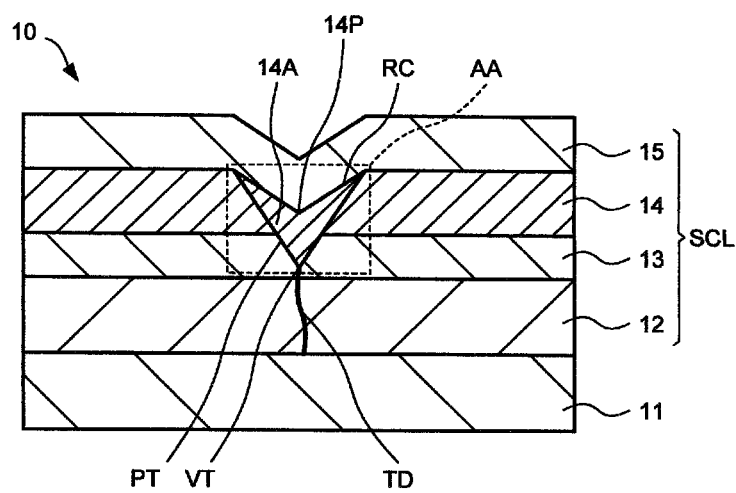
FIG. 1B is a cross-sectional view schematically partially illustrating a configuration, adjacent to a pit, of a semiconductor light emitting element of the first embodiment.

FIG. 1A shows a top view of a semiconductor light emitting element 10 (hereinafter simply referred to as the light emitting element or element) according to the first embodiment. FIG. 1B shows a cross-sectional view schematically partially illustrating a configuration of the semiconductor light emitting element 10. FIG. 1B shows a cross-section cut along a line V-V shown in FIG. 1A. The light emitting element 10 has a semiconductor structure layer SCL formed on a substrate 11. The semiconductor structure layer SCL has a threading dislocation TD which is caused by the lattice mismatch between the substrate 11 and the semiconductor structure layer SCL. The semiconductor structure layer SCL has a pyramidal pit PT due to the threading dislocation TD.

In the present embodiment, the semiconductor structure layer SCL is made from nitride-based semiconductors. Hereinafter a situation that the pit PT has a hexagonal pyramid-shaped form is described. Further, the present embodiment of the semiconductor structure layer SCL is made from GaN-based semiconductors is described. Further, the substrate 11 is made of sapphire, for example. The semiconductor structure layer SCL is grown on a C-plane of sapphire.

The light emitting element 10 has an n-type semiconductor layer 12 (first semiconductor layer) formed on the substrate 11. The n-type semiconductor layer 12 is a Si doped GaN layer, for example. The n-type semiconductor layer 12 has the threading dislocation TD caused by the misfit dislocation generated on the interface with the substrate 11, and the threading dislocation TD is formed to penetrate the n-type semiconductor layer 12.

The light emitting element 10 is formed on the n-type semiconductor layer 12. The light emitting element 10 has a pit formation layer 13 including the pyramidal pit PT caused by the threading dislocation TD generated in the n-type semiconductor layer 12. Specifically, the pit formation layer 13 has the threading dislocation TD penetrating the n-type semiconductor layer 12 into the pit formation layer 13. In other words, the threading dislocation TD is formed to have such a depth that the threading dislocation originates at the interface between the substrate 11 and the n-type semiconductor layer 12 and penetrates the n-type semiconductor layer 12 into the pit formation layer 13. Further, the pit formation layer 13 has a hexagonal pyramid-shaped pit PT having the apex VT being a dislocation point of the threading dislocation TD in the pit formation layer 13. The pit PT may be formed inside the pit formation layer 13, for example, by forming a super-lattice structure layer as the pit formation layer 13. In the present embodiment, the pit formation layer 13 may have super-lattice structure (SLS) configured with at least one well layer (not shown) and at least one barrier layer (not shown). This case will be described as follows.

The light emitting element 10 has an active layer 14 formed on the pit formation layer 13. The active layer 14 has an embedded portion 14A formed to embed the pit PT. Further, the active layer 14 has the recess portion RC corresponding to the pit PT on the surface of the embedded portion 14A. The recess portion RC has a pyramidal shape, whose apex 14P is formed at a point corresponding to the apex VT of the pit PT. In other words, the trace of the pit PT remains as the recess portion RC in the surface of the active layer 14.

The light emitting element 10 has a p-type semiconductor layer 15 (the second semiconductor layer) which is subsequently formed on the active layer 14 and has an opposite conductivity type to the n-type semiconductor layer 12. The p-type semiconductor layer 15 is made from a Mg doped GaN layer, for example. In addition, the p-type semiconductor layer 15 may have an electron blocking layer (not shown) such as AlGaN layer in the interface with the active layer 14, in which the electron blocking layer has a band gap larger than that of the other portion of the p-type semiconductor layer 15. Further, the light emitting element 10 has the n-electrode (not shown) and the p-electrode (not shown) which apply a voltage across the n-type semiconductor layer 12 and the p-type semiconductor layer 15. In addition, the entirety including the n-type semiconductor layer 12, the pit formation layer 13, the active layer 14 and the p-type semiconductor layer 15 is referred to as a semiconductor structure layer SOL.

Figure 2A:
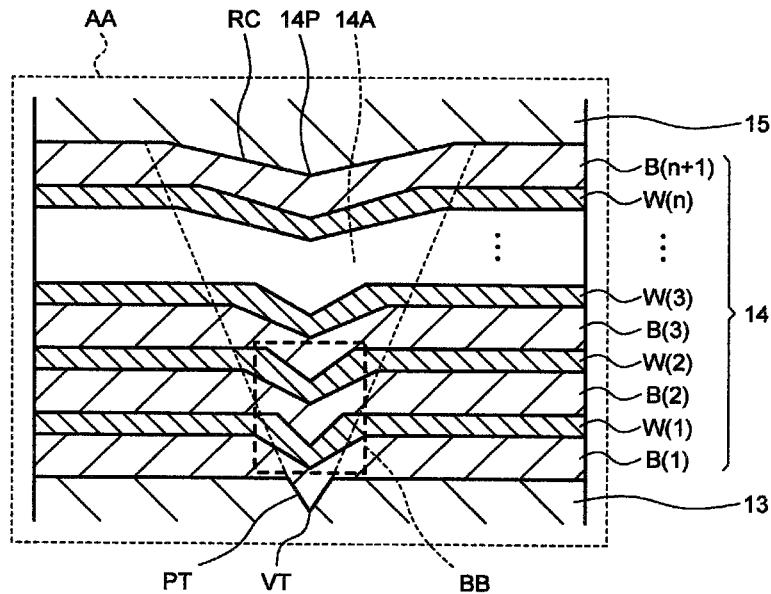
FIG. 2A, FIG. 2B and FIG. 2C are cross-sectional views schematically partially illustrating configurations of the pit, an embedded portion, and a portion thereof in a semiconductor light emitting element of the first embodiment.

FIG. 2A shows a cross-sectional view schematically partially illustrating a configuration of the active layer 14 of the light emitting element 10. FIG. 2A shows a partially enlarged cross-sectional view of a portion AA surrounded by a broken line shown in FIG. 1B. As shown in FIG. 2A, the active layer 14 has a multi-quantum well (MQW) structure having one or more well layers W(1)-W(n) and one or more barrier layers B(1)-B(n) laminated alternately in which each well layer and each barrier layer lie one upon another. The MQW will be described herein to have "n" number of well layers and "n" number of barrier layers. In the present embodiment, the "n" number of well layers W(1)-W(n) are InGaN layers and the "n" number of barrier layers B(1)-B(n) are GaN layers.

Specifically, the first barrier layer B(1) is layered on the pit formation layer 13, and the first well layer W(1) is layered on the first barrier layer B(1), and the second barrier layer B(2) is layered on the first well layer W(1) in sequence. Similarly, on the second barrier layer B(2), the well layers W(2)-W(n) and the barrier layers B(3)-B(n) are alternately layered. Further, the "(n+1)"th barrier layer B(n+1) is formed on the "n"th well layer W(n) proximate to the p-type semiconductor layer 15. The p-type semiconductor layer 15 is formed on the "(n+1)"th barrier layer B(n+1).

Figure 2B:
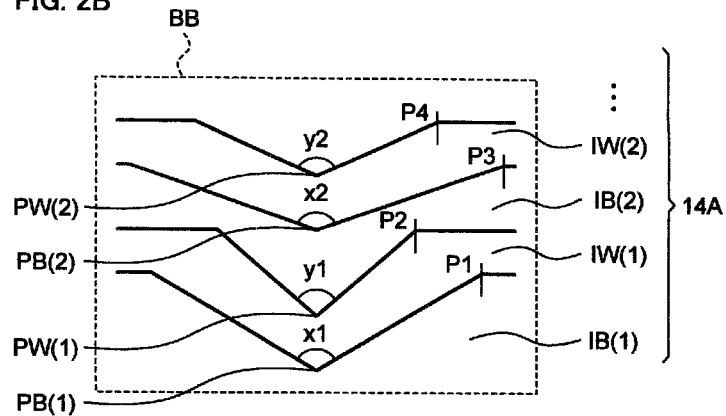

The embedded portion 14A is one portion of lamination of the "n" number of well layers W(1)-W(n) and the "n" number of barrier layers B(1)-B(n) which corresponds to a portion formed to embed the pit PT. FIG. 2B is a cross-sectional view schematically partially illustrating a detailed configuration of the embedded portion 14A. FIG. 2B shows a partially enlarged cross-sectional view of a portion BB surrounded by a broken line shown in FIG. 2A, FIG. 2B have no hatching for figure clarity.

The embedded portion 14A has the "n" number of embedded well portions IW(1)–IW(n) corresponding to the "n" number of well layers W(1)-W(n) respectively and the "n" number of embedded barrier portions IB(1)-IB(n) corresponding to the "n" number of barrier layers B(1)-B(n) respectively. In addition, FIG. 2B shows two of the embedded well portions IW(1) and IW(2) adjacent to the pit formation layer 13 and two of the embedded barrier portions IB(1) and IB(2) in the embedded portion 14A.

Further, the "n" number of embedded well portions IW(1)-IW(n) have apexes PW(1)-PW(n) on their respective interfaces nearer to the interface with the p-type semiconductor layer 15, in which the apexes PW(1)-PW(n) are positioned at the respective points each corresponding to the apex VT of the pit PT in the respective interfaces. Further, the "n" number of embedded barrier portions IB(1)-IB(n) have apexes PB(1)-PB(n) on their respective interfaces nearer to the interface with the p-type semiconductor layer 15, in which the apexes PB(1)-PB(n) are positioned at the respective points each corresponding to the apex VT of the pit PT in the respective interfaces. In addition, FIG. 2B shows two apexes PW(1) and PW(2) of the embedded well portions IW(1) and IW(2) and two apexes PB(1) and PB(2) of the embedded barrier portions IB(1) and IB(2) on the side of the pit formation layer 13.

In other words, each of the "n" number of embedded well portions IW(1)-IW(n) and the "n" number of embedded barrier portions IB(1)-IB(n) has inclined faces (facets) formed to extend from each of the apexes toward the p-type semiconductor layer 15. Thus the embedded portion 14A has a structure configured to have the inclined faces of the "n" number of embedded well portions IW(1)-IW(n) and the "n" number of embedded barrier portions IB(1)-IB(n) consecutively formed in the layered direction of the semiconductor structure layer SCL.

Figure 2C:
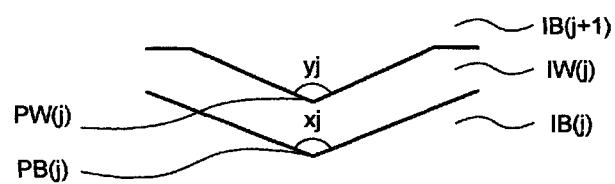

Each of the "n" number of embedded well portions IW(1)-IW(n) and the "n" number of embedded barrier portions IB(1)-IB(n) is configured such a manner that the apex angle yj (the second apex angle) of the apex PW(j) in the embedded well portion IW(j) is smaller than the apex angle xj (the first apex angle) of the apex PB(j) of the embedded barrier portion IB(j) ($1 \le j \le n$: j and n denote integers) in the "n" number of embedded well portions IW(1)-IW(n) and the "n" number of embedded barrier portions IB(1)-IB(n), as shown in FIG. 2C. The embedded well portion IW(j) is subsequently formed on the adjacent embedded barrier portion IB(j) and the embedded barrier portion IB(j+1) is formed thereon adjacently in the "n" number of embedded well portions IW(1)-IW(n) and the "n" number of embedded barrier portions IB(1)-IB(n).

For example as shown in FIG. 2B, regarding the embedded well portion IW(2) and the embedded barrier portion IB(2) situated adjacent to each other, the apex angle y2 (the second apex angle) of the apex PW(2) in the embedded well portion IW(2) is smaller than the apex angle x2 (the first apex angle) of the apex PB(2) in the embedded barrier portion IB(2).

Further, when n≥2, i.e. the embedded portion 14A has plural embedded well portions, the "n" number of embedded well portions IW(1)-IW(n) are configured such that the closer to the p-type semiconductor layer 15 the embedded well portions become, the greater the apex angles y1-yn of the apexes PW(1)-PW(n) become. Specifically, for example, as shown in FIG. 2B, the apex angle y2 of the apex PW(2) of the second embedded well portion IW(2) is larger than the apex angle y1 of the apex PW(1) of the first embedded well portion IW(1). Further, the apex 14P of the recess portion RC has an apex angle larger than the apex VT of the pit PT.

Similarly, the "n" number of embedded barrier portions IB(1)-IB(n) are configured such that the closer to the p-type semiconductor layer 15 the embedded barrier portions become, the greater the apex angles x1-xn of the apexes PB(1)-PB(n) become. Specifically, for example, as shown in FIG. 2B, the apex angle x2 of the apex PB(2) of the second embedded barrier portion LB(2) is larger than the apex angle x1 of the apex PB(1) of the first embedded barrier portion IB(1).

The "n" number of embedded well portions IW(1)-IW(n) and the "n" number of embedded barrier portions IB(1)-IB(n) can be formed in the following growth conditions. Firstly, the well layer W(j) is grown at a temperature higher than a growth temperature for a typical InGaN layer. Whereas the barrier layer B(j) is grown and formed up to a thickness thinner than a typical barrier layer at a temperature lower than a growth temperature for a typical GaN layer with a rate slower than a growth rate for a typical GaN layer.

When a GaN layer is grown as a barrier layer B(j) in consideration of the above conditions, a formation end boundary (boundary between the flat face and the inclined face) of the embedded barrier portion IB(j) is positioned comparatively distant from the center of the pit PT. Whereas, when a well layer W(j) is formed at a temperature higher than a conventionally used temperature, an InGaN layer as the well layer W(j) has a promoted growth rate in the lateral direction of the InGaN layer (in-plane direction). Thus, the formation end boundary of the embedded well portion IW(j) is closer to the center of the pit PT than the formation end boundary of the embedded barrier portion IB(j) is. Further, when the well layer W(j) and the barrier layer B(j) are grown continuously under the foregoing conditions, the formation end boundaries of the embedded well portion and the embedded barrier portion go gradually away from the pit PT respectively. For example, a formation end boundary P1 of the embedded barrier portion IB(1), a formation end boundary P2 of the embedded well portion IW(1), a formation end boundary P3 of the embedded barrier portion IB(2), and a formation end boundary 24 of the embedded well portion IW(2) have a positional relation as shown in FIG. 23.

Further, when the active layer 14 is grown under the condition described above, the apex angle xj in the surface of the embedded barrier portion 13(j) becomes larger (i.e., changes toward an obtuse angle) during the growth of the barrier layer B(j), and the apex angle yj in the surface of the embedded well portion IW(j) becomes smaller (i.e., changes toward an acute angle) during the growth of the well layer W(j). In this manner, the active layer 14 having the embedded portion 14A which puts in the pit PT and having an angle relationship between the apex angle xj of the embedded barrier portion 13(j) and the apex angle yj of the embedded well portion IW(j) is formed as mentioned above.

In addition, it is preferable that the apex angle of the apex 14P of the recess portion RC, i.e., the apex angle of the apex of the embedded barrier portion corresponding to the barrier layer B(n+1) is an angle of 150 degree or less. When the apex angle of the apex 14P of the recess portion RC is beyond the angle 150 degree, there is a very small difference in thickness between the embedded well portion IW(n) in the pit PT and the well layer W(n) other than the pit PT. Therefore, the energy level difference between both of the embedded well portion IW(n) and the well layer W(n) becomes very small. In this case, the embedded well portion IW(n) in the pit PT has a lowered function so as to act as a barrier to electrons in the well layer W(n) other than the pit PT, resulting in increasing probability of carriers reaching the threading dislocation TD. Particularly, since the probability of carriers reaching the threading dislocation TD increases as the temperature increases, luminous efficiency greatly varies depending on the temperature.

Figure 3:
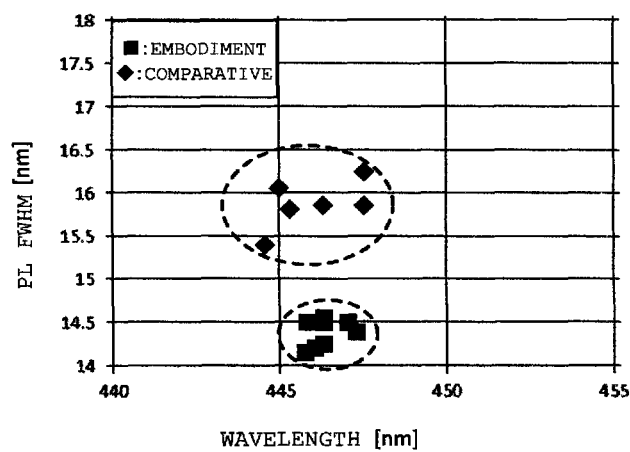
FIG. 3 is a graph showing results of PL measurement of the light emitting elements of the first embodiment and comparative examples.

FIG. 3 is a graph showing light emission distributions inside the layer of the light emitting elements 10 of the embodiments and comparative examples. In FIG. 3, the horizontal axis represents wavelengths, and the vertical axis represents values of the full width at a half maximum (FWHM) of spectrum obtained by the PL (Photo luminescence) measurement. In addition, each comparative examples of light emitting element has the same configuration as the present embodiment having the light emitting element 10 except that its active layer is grown at the temperature of about 820 degrees centigrade (lower than that of the present embodiment) at which it is to be suitable for pit formation. The PL measurement has been performed for the comparative examples.

As seen from FIG. 3, the present embodiments exhibit FWHM values of spectrum about 14 nm-14.5 nm versus the comparative examples exhibit about 16.5 nm. In other words, the present embodiment of the light emitting element 10 exhibits uniformity of the light emission distribution more than the comparative examples. This implies that undulation of the well layer of InGaN layer is suppressed in the present embodiment. In addition, the inventors also have found that, in the present embodiment, there is inhibited lowering of light output of the light emitting element 10 when driven at high temperatures.

Here will be described a mechanism in which uniformity of the light emission distribution is obtained by the light emitting element 10. Firstly, the pit PT has a function to prevent carriers (injected into the active layer 14) from accessing the threading dislocation TD. Specifically, the embedded portion 14A grown on the side surface of the pit PT in the active layer 14 has a thickness thinner than that of the other flat portion in the active layer 14. Thus, the embedded portion 14A has a larger band gap in comparison with the other flat portion.

Therefore, carriers are prevented from entering the pit PT, i.e., arrival of carriers at the threading dislocation TD is restricted. Thus, recombination of carriers without light emission is restricted at the threading dislocation TD, resulting in enabling the prevention of lowering light emission intensity. The pit formation is performed in general that the active layer is grown at a growth temperature lower than the ordinary growth temperature to keep the pit shape. When pit formation is performed while taking the preservation of the pit shape into consideration, undulations occur on the active layer in the other flat portion. Therefore, the light emission distribution in the active layer becomes non-uniform.

In contrast, the active layer 14 is formed to prevent the occurrence of undulations on the active layer while keeping the pit structure in the present embodiment. Therefore, as shown in FIG. 3, the light emitting element 10 has been made in which the light emission distribution is remarkably uniform in comparison with those of the comparative examples and a high light emission intensity exhibits even in driving the light emitting element by a large current.

In addition, for the present embodiment, there have been explained the case that the "n" number of embedded well portions IW(1)-IW(n) are configured so as to have the apexes PW(1)-PW(n) with the apex angles y1-yn which are gradually increased respectively as the embedded well portions approach the p-type semiconductor layer 15 respectively. But the apex angle relationship in the "n" number of embedded well portions IW(1)-IW(n) is not limited to this embodiment, as far as the apex angle relationship in the embedded well portion IW(j) and the embedded barrier portion IB(j) situated adjacent to each other meets the conditions such that the apex angle yj of the apex PW(j) in the embedded well portion IW(j) is smaller than the apex angle xj of the apex PB(j) in the embedded barrier portion IB(j) ($1 \leq j \leq n$: j and n denote integers) wherein the embedded well portion IW(j) is subsequently formed on the adjacent embedded barrier portion IB(j), as mentioned above. For example, the apex angles y1-yn of the apexes of the "n" number of embedded well portions IW(1)-IW(n) may include the same angles in part. In addition, the apex angles of the embedded well portions are gradually increased by adjusting the growth conditions while preferentially taking into consideration to suppress undulations of the InGaN layer as the well layer.

In the present embodiment, the active layer 14 has the embedded portion 14A on the pit PT in which the embedded portion 14A is configured such that the apex angle yj (the second apex angle) of the apex PW(j) in the embedded well portion IW(j) is smaller than the apex angle xj (the first apex angle) of the apex PB(j) of the embedded barrier portion IB(j) wherein the embedded well portion IN(j) is subsequently formed on the adjacent embedded barrier portion IB(j) in the "n" number of embedded well portions IW(1)-IW(n) and the "n" number of embedded barrier portions IB(1)-IB(n) ($1 \leq j \leq n$: j and n denote integers). Therefore, the present embodiment enables the function of pit PT effectively and provides a light emitting element with an excellent surface flatness and a high luminous efficiency.

Figure 4A:
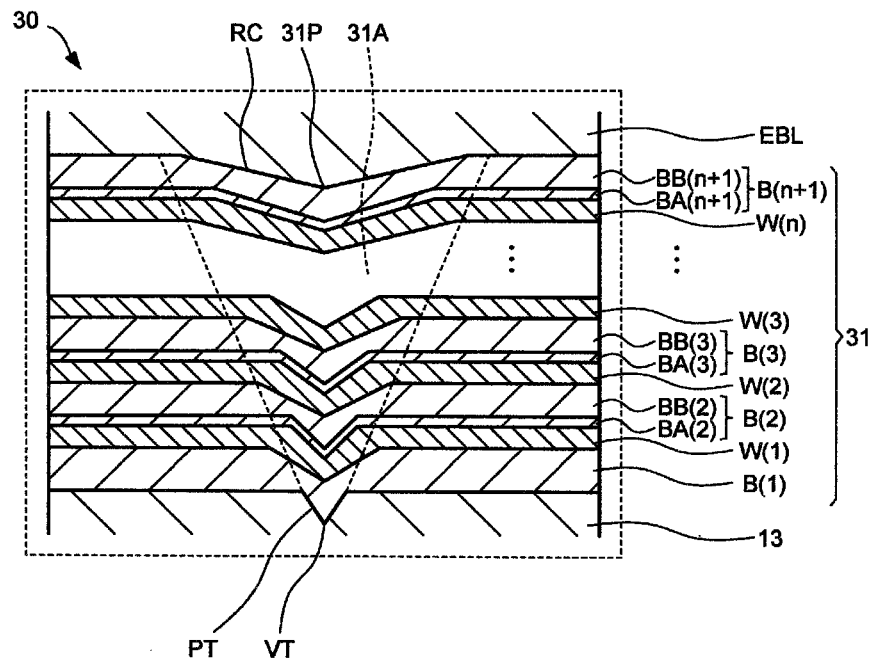
FIG. 4A is a cross-sectional view schematically partially illustrating a configuration, adjacent to a pit, of a semiconductor light emitting element of a modified embodiment from the first embodiment.

FIG. 4A is a cross-sectional view schematically illustrating a configuration of a semiconductor light emitting element 30 of a modified embodiment from the first embodiment. The light emitting element 30 has the same configuration as the light emitting element 10 of the first embodiment except that another active layer 31 is provided instead of the active layer 14 and an electron blocking layer EBL is provided between the active layer 31 and the p-type semiconductor layer 15. FIG. 4A shows a cross-sectional view of the light emitting element 30 similar to FIG. 2A and shows the configuration of the active layer 31.

The active layer 31 has the "(n+1)" number of barrier layers B(1)-B(n+1) in which the barrier layer B(1) proximate to the n-type semiconductor layer 12 is different in configuration from the barrier layers B(2)-B(n+1) other than the barrier layer B(1). Firstly, the "n" number of barrier layers B(2)-B(n+1) have first barrier layers BA(2)-BA(n+1) and second barrier layers BB(2)-BB(n-1) respectively wherein each of the second barrier layers has a band gap larger than that of each of the first barrier layers BA(2)-BA(n+1). In other words, each of the "n" number of barrier layers B(2)-B(n+1) has two barrier layers having band gaps different from each other.

Each of the first barrier layers BA(2)-BA(n+1) is made from InGaN layer, for example. Each of the second barrier layers BB(2)-BB(n+1) is made from GaN layer, for example. Further, the barrier layer B(1) proximate to the n-type semiconductor layer 12 is made from InGaN and has a band gap which is smaller (narrower) than that of each of the first barrier layers BA(2)-B(n+1) and is larger (wider) than that of each of the well layers W(1)-W(n).

The active layer 31 has an embedded portion 31A corresponding to a portion above the pit PT in the active layer 31. Further, the active layer 31 has a recess portion 31P on the embedded portion 31A corresponding to a pit PT. Further, the embedded portion 31A has an embedded barrier portion corresponding to the barrier layer B(1) proximate to the n-type semiconductor layer 12; and the "n" number of embedded well portions corresponding to the "n" number of well layers W(2)-W(n+1) respectively; and the "n" number of first embedded barrier portions corresponding to the "n" number of first barrier layers BA(2)-BA(n+1) respectively; and the "n" number of second embedded barrier portions corresponding to the "n" number of second barrier layers BB(2)-BB(n+1) respectively.

Figure 4B:
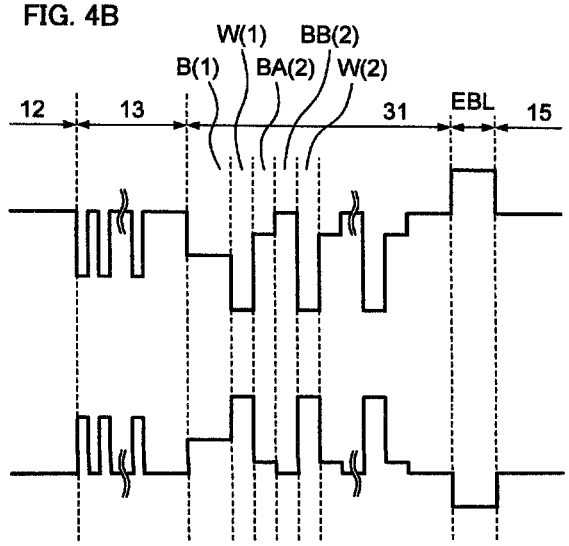
FIG. 4B is a band diagram schematically illustrating a semiconductor structure layer of the semiconductor light emitting element of a modified embodiment from the first embodiment.

FIG. 4B is a band diagram schematically illustrating a semiconductor structure layer SCL of the semiconductor light emitting element 30. The band gap structure of the layers between the n-type semiconductor layer 12 and the p-type semiconductor layer 15 in the light emitting element 30 will be described with reference to FIG. 4B. Firstly, the pit formation layer 13 has the super-lattice structure. Therefore, the barrier layer and the superlattice layer are layered alternately and plural times in which the barrier layer has a band gap being substantially the same level as that of the n-type semiconductor layer 12 and the superlattice layer has a band gap being smaller than that of the barrier layer.

Further, the first barrier layer BA(j) in the active layer 31 has a band gap slightly smaller than that of the second barrier layer BB(j). Further, the second barrier layer BB(j) has a band gap being substantially the same level as those of the n-type semiconductor layer 12 and the p-type semiconductor layer 15. Further, the barrier layer B(1) proximate to the n-type semiconductor layer 12 has the band gap which is smaller than that of each of the first barrier layers BA(2)-B(n+1) and is larger than that of each of the well layers W(1)-W(n).

The electron blocking layer EBL has a band gap larger than those of the second barrier layer BB(j) and the p-type semiconductor layer 15 in the active layer 31. Further, the electron blocking layer EBL has a thickness sufficient to perform the electron blocking function on the pit PT. Thus the electron blocking layer EBL has the band gap at the same level as a whole.

As described in the first embodiment, it is preferable that the apex angle of the apex 14P of the recess portion RC is an angle of 150 degree or less. In the present modified embodiment, the apex angle of the apex 14P of the recess portion RC can be easily adjusted in comparison with the first embodiment. In other words, it is able to set an angle of 150 degree or less of the apex 31P of the recess portion RC in the present modified embodiment. Specifically, by having the barrier layer include an InGaN layer, the increase of the apex angle of the embedded barrier portion is restricted during the growth of the barrier layer, resulting in preventing the apex angle of the embedded barrier portion from increasing prior to formation of the desired well layer. Therefore, the present modified embodiment enables to make the pit PT effectively function in addition to the advantageous effect obtained by the light emitting element 10 of the first embodiment.

Furthermore, in the present embodiment and the present modified embodiment, there is described that the first conductivity type is a p-type and the second conductivity type is an n-type opposite conductivity type to the p-type. Furthermore, the first conductivity type may be the n-type and the second conductivity type may be a p-type.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed embodiments but may be practiced within the full scope of the appended claims.

This application is based upon and claims the benefit of priority from the prior Japanese Patent Application No. 2014-192284 filed on Sep. 22, 2014, the entire contents of which are incorporated herein by reference.

What is claimed is:

1. A semiconductor light emitting element comprising:
   a first semiconductor layer of a first conductivity type;
   a pit formation layer formed on said first semiconductor layer and having a pyramidal pit caused by a threading dislocation generated in said first semiconductor layer;
   an active layer formed on said pit formation layer and having an embedded portion formed so as to embed said pyramidal pit; and
   a second semiconductor formed on said active layer and having a second conductivity type which is opposite to the first conductivity type,
   wherein:
   said active layer has a multi-quantum well structure having at least one well layer and at least one barrier layer laminated alternately in which each well layer and each barrier layer lie one upon another,
   said embedded portion has at least one embedded well layer corresponding to said at least one well layer and at least one embedded barrier layer corresponding to said at least one barrier layer such that each embedded well layer and each embedded barrier layer lie one upon another,
   said embedded barrier layer has a pyramidal recess corresponding to said pyramidal pit formed in its surface and having a first apex with a first apex angle defined by its internal surface,
   said embedded well layer has a pyramidal recess corresponding to said pyramidal pit formed in its surface and having a second apex with a second apex angle defined by its internal surface,
   each of said at least one embedded well layer and said embedded barrier layer is configured such that said pyramidal recess of the embedded well layer and said Pyramidal recess of the embedded barrier layer are situated adjacent to each other and overlapped with other, and
   the second apex angle of the second apex of said embedded well layer is smaller than the first apex angle of the first apex of said embedded barrier layer neighboring on the embedded well layer, the second apex of the embedded well layer being closer to the second semiconductor than the first apex of the embedded barrier layer.

2. The semiconductor light emitting element according to claim 1, wherein:
   said embedded portion has a plurality of embedded well portions, and
   said plurality of embedded well portions are configured so as to have the apex angles which are gradually increased respectively as the embedded well portions approach said second semiconductor layer from said it formation layer.

3. The semiconductor light emitting element according to claim 1, wherein each of said at least one barrier layer has a first barrier layer and a second barrier layer having a band gap larger than that of said first barrier layer.

4. The semiconductor light emitting element according to claim 1, wherein each of said first semiconductor layer, said pit formation layer, said active layer and said second semiconductor layer is made of nitride-based semiconductor materials.

\* \* \* \* \*